US008268676B2

(12) United States Patent
Krishnan et al.

(10) Patent No.: US 8,268,676 B2
(45) Date of Patent: Sep. 18, 2012

(54) PROCESS OF FORMING AN ELECTRONIC DEVICE INCLUDING REMOVING A CONDUCTIVE MEMBER TO FORM A TRENCH AND ELECTRICALLY ISOLATE LEADS

(75) Inventors: Shutesh Krishnan, Negeri Sembilan (MY); Chee Hiong Chew, Seremban (MY); Jatinder Kumar, Jalandhar (IN)

(73) Assignee: Semiconductor Components Industries, LLC, Phoenix, AZ (US)

( * ) Notice: Subject to any disclaimer, the term of this patent is extended or adjusted under 35 U.S.C. 154(b) by 218 days.

(21) Appl. No.: 12/697,002

(22) Filed: Jan. 29, 2010

(65) Prior Publication Data

US 2011/0115061 A1   May 19, 2011

(30) Foreign Application Priority Data

Nov. 13, 2009   (MY) .............................. PI 20094818

(51) Int. Cl.
*H01L 21/60* (2006.01)

(52) U.S. Cl. ................. 438/123; 438/124; 257/E21.506
(58) Field of Classification Search ........... 438/123–124
See application file for complete search history.

(56) References Cited

U.S. PATENT DOCUMENTS

| 7,402,895 B2 | 7/2008 | Krishnan et al. |
| 2007/0001278 A1* | 1/2007 | Jeon et al. ..................... 257/676 |
| 2009/0102028 A1 | 4/2009 | Krishnan et al. |

* cited by examiner

*Primary Examiner* — Thanh Nguyen

(57) ABSTRACT

An electronic device can include a packaging material having a first surface and a second surface opposite the first surface, and leads including die connection surfaces and external connection surfaces. The electronic device can further include a trench extending from an upper surface of the packaging substrate towards a lower surface of the packaging substrate, wherein a set of leads lie immediately adjacent to the trench, and the packaging material is exposed at the bottom of the trench. In an embodiment, an encapsulant is formed over the upper surface of the packaging substrate and within the trench. In a particular embodiment, the trenches may be formed before or after placing a die over the packaging substrate, or before or after forming electrical connections between the die and leads of the packaging substrate.

18 Claims, 7 Drawing Sheets

PROCESS OF FORMING AN ELECTRONIC DEVICE INCLUDING REMOVING A CONDUCTIVE MEMBER TO FORM A TRENCH AND ELECTRICALLY ISOLATE LEADS

FIELD OF THE DISCLOSURE

The present disclosure relates to electronic devices and processes of forming electronic devices, and more particularly to, electronic devices including packaging substrates having trenches and processes of forming the same.

RELATED ART

Integrated circuits can include a die that is encapsulated within a plastic package. Packaging techniques are becoming more complicated as the number of terminals of a die and leads of a packaging substrate increase. A particular type of plastic package can include a plastic substrate, wherein a molding compound is formed between leads and potentially other features of a leadframe. A conductive strip can be used to hold many leads of the leadframe in place when the molding compound is being formed around the lead frame. If any molding compound is formed over an electrical contacting surface of the lead frame, such as a lead or a flag when a die is subsequently attached, such excess molding compound may be removed. A die is then attached to the flag, and wires can be bonded between bonding pads of the die and leads of the lead frame. An encapsulant is then formed over the molding compound, leadframe, die, and wires.

The conductive strip used to hold the leads of the leadframe in place is present when the encapsulant is formed. A series of mechanical and chemical operations are used to remove the conductive strip to that the leads are no longer electrically connected to one another. At this point in the process, an electrically functional integrated circuit with a plastic package is formed.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Figure 1:
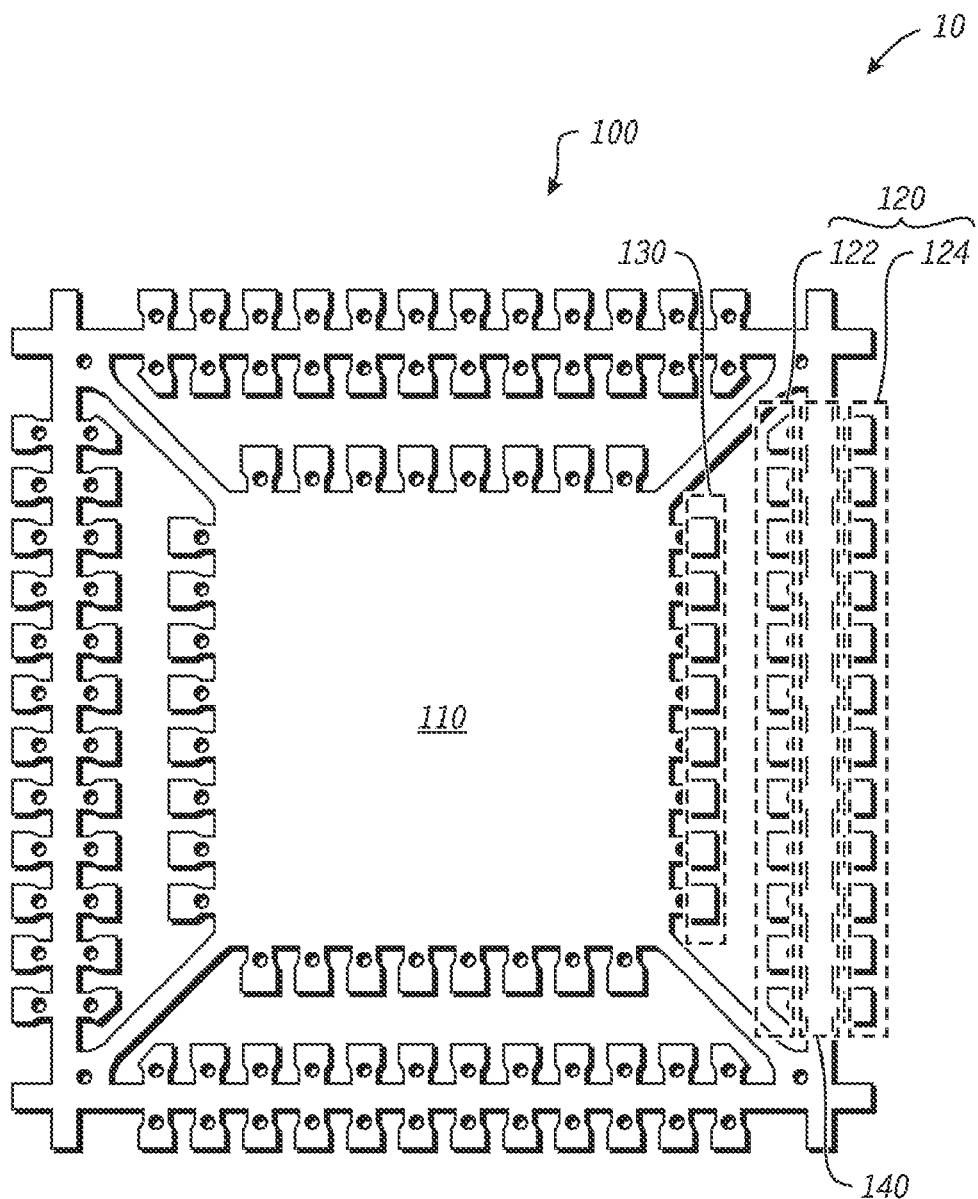
FIG. 1 includes an illustration of a top view of a portion of a leadframe.

FIG. 1 includes a top view of a leadframe 100 that can be used within an electronic device 10. Although not illustrated, many other leadframes can be connected to the leadframe 100 to allow for more efficient processing but are not illustrated in FIG. 1. In one embodiment, the leadframe 100 includes a conductive flag 110 for receiving a die or another electronic component. The conductive flag 110 is optional, and therefore, in another embodiment, the conductive flag is not present. The leadframe 100 further includes a set of leads 120 that includes leads 122 and 124, wherein the leads 122 and 124 lie along an opposite sides of conductive members 140, which may also be referred to as connecting bars or dams. The conductive members 140 provide mechanical support to maintain the proper placement of the set of leads 120 during a subsequent operation. As illustrated in the embodiment of FIG. 1, the leads 122 lie closer to the edge of the leadframe 100, as compared to the leads 124, and the leads 124 lie between the leads 122 and the conductive flag 110. The leadframe 100 further includes another set of leads 130 that are electrically connected to the conductive flag 110. Only one set of leads 122, 124, and 130 are illustrated within dashed lines in FIG. 1. Clearly, the other sets of leads 122, 124, and 130 lie closer to the other sides of the leadframe 100.

The leadframe 100 can include a conventional or proprietary conductive material. In a particular embodiment, the leadframe 100 can include substantially the same composition at different lateral positions. For example, the composition of the conductive flag 110 can include the same composition as the conductive members 140. In another embodiment, different portions of the leadframe 100 may include different materials. For example, surfaces that will be wired bonded or otherwise used to electrically connect such surfaces to other parts of the electronic device 10 may include material that improves adhesion for wires, solder, or another similar compound. The conductive member 140 may not include such material.

Figure 2:
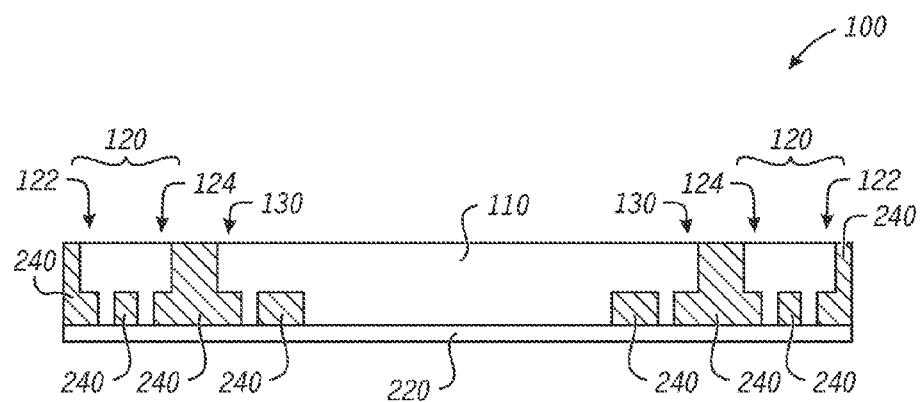
FIGS. 2 and 3 include illustrations of a cross-sectional view and a top view, respectively, of the leadframe of FIG. 1 after applying a tape to external conductive surfaces of leads and after forming a packaging material in open spaces between features of the lead frame.
Figure 3:
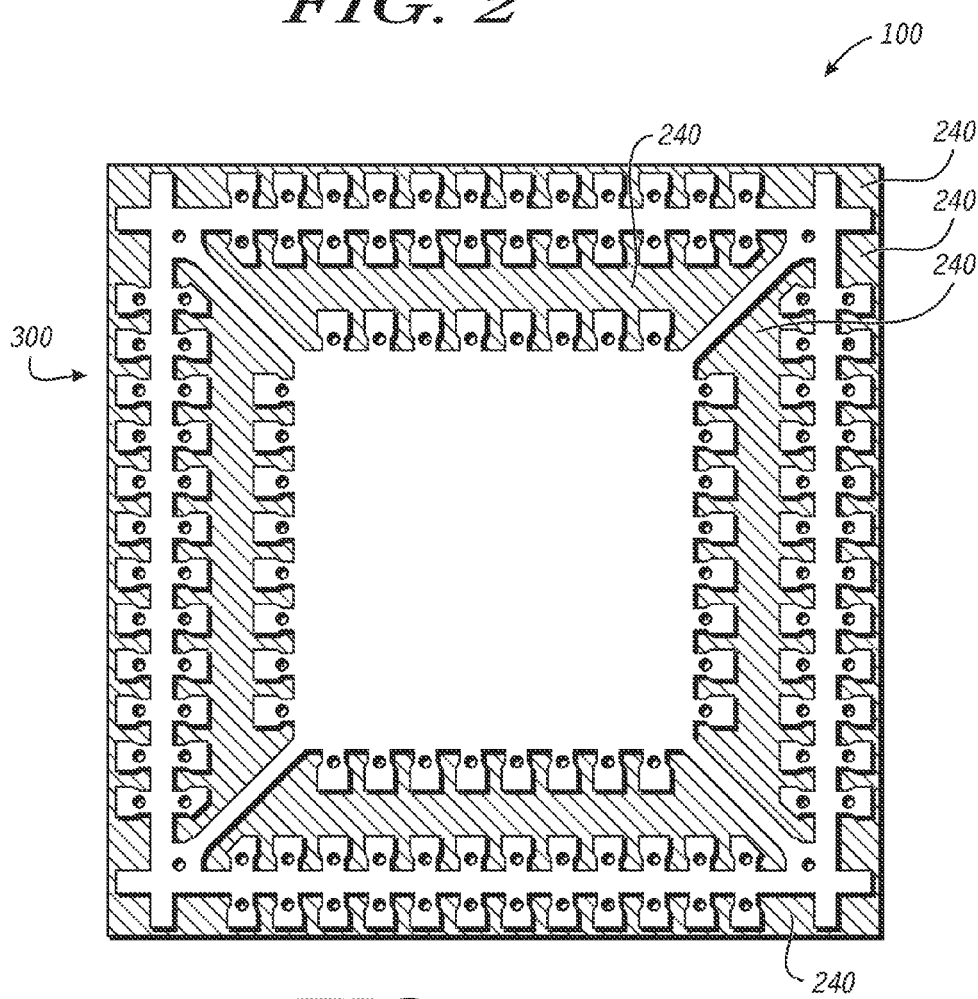

FIGS. 2 and 3 include a cross-sectional view and a top view, respectively, after forming a packaging material within the voids between features of the leadframe 100. In the embodiment as illustrated in FIGS. 2 and 3, tape 220 is placed along the bottom surface of the leadframe 100 where external contacts will be made to the electronic device. After the tape 220 has been placed along the bottom surface, a packaging material 240 can be introduced in voids between features, such as the leads and conductive flag, of the leadframe 100. The packaging material 240 can be an insulating material. In a particular embodiment, the packaging material 240 includes a conventional or proprietary molding compound. Dams or other processing aids (not illustrated) may be used to help contain the packaging material 240. If any of the packaging material 240 forms on the upper surfaces (surfaces opposite the tape 220) of the leads 122, 124, or 130 or the conductive flag 110, such excess packaging material 240 may be removed. In another embodiment, the packaging material 240 can include a fiberglass/epoxy resin or another material used as a substrate within a printed wiring board. At this point in the process, a packaging substrate 300 has been formed and includes the leadframe 100 and packaging material 240. The tape 220 may be removed after the packaging substrate 300 is formed. Alternatively, the tape 220 may be removed later in the process if needed or desired.

The surface of the packaging substrate 300 may be roughened to improve adhesion to a subsequently-formed encapsulant. In one embodiment, laser ablation can be used. In a particular embodiment, the laser can be an ultraviolet laser, a YAG laser, an infrared laser, or the like. During laser ablation, the exposed surfaces of the leadframe 100 may also be roughened. A cleaning operation may be performed to remove any material from laser ablation that redeposited on the packaging substrate 300. In another embodiment, mechanical roughening, such as buffing, grinding, sand blasting, or the like, may be used. Roughening may be performed after the packaging substrate 300 is formed and before any features are attached to the packaging substrate. Thus, the roughening can be performed at this time or at any time before a die is placed over the packaging substrate 300. After reading this specification, skilled artisans will appreciate that roughening is not required, but if used, roughening can be performed using a variety of techniques and at different times in the process flow.

The leads 122, 124, and 130 have pairs of opposing surfaces that lie along opposite sides of the packaging substrate 300. In the embodiment as illustrated in FIG. 2, the upper surfaces of the leads 122, 124, and 130 are the die connection surfaces where wire bonds or a solder material will electrically connect terminals of a die (not illustrated in FIG. 2) and such surfaces. The lower surfaces of the leads 122, 124, and 130 are external connections surfaces that are used to connect the packaging substrate 300 to other components outside of the packaging substrate 300, such as a printed wiring board, a socket, or another part of an electronic device. The upper surfaces should lie at the same elevation; however, there may be slight differences in elevation between the elevations of such surfaces. Thus, the upper surfaces can be characterized by an averaged elevation. As used herein, the term "averaged" is intended to mean an average, a median, or a geometric mean. Similarly, the lower surfaces should lie at the same elevation; however, there may be slight differences in elevation between the elevations of such surfaces. Thus, the lower surfaces can be characterized by an averaged elevation that is different from the averaged elevation of the upper surfaces.

Figure 4:
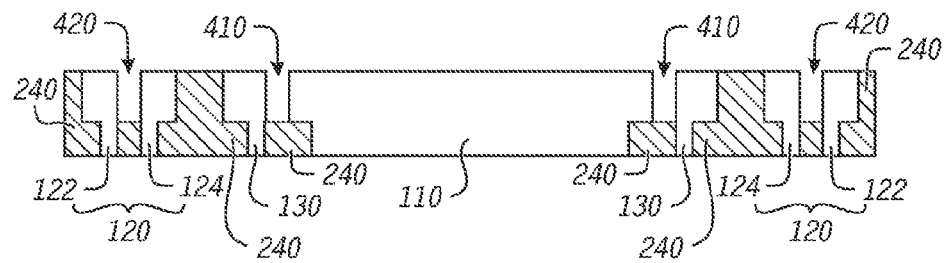
FIGS. 4 and 5 include illustrations of a cross-sectional view and a top view, respectively, of the packaging substrate of FIGS. 2 and 3 after removing conductive members to form trenches that electrically isolate leads from one another.
Figure 5:
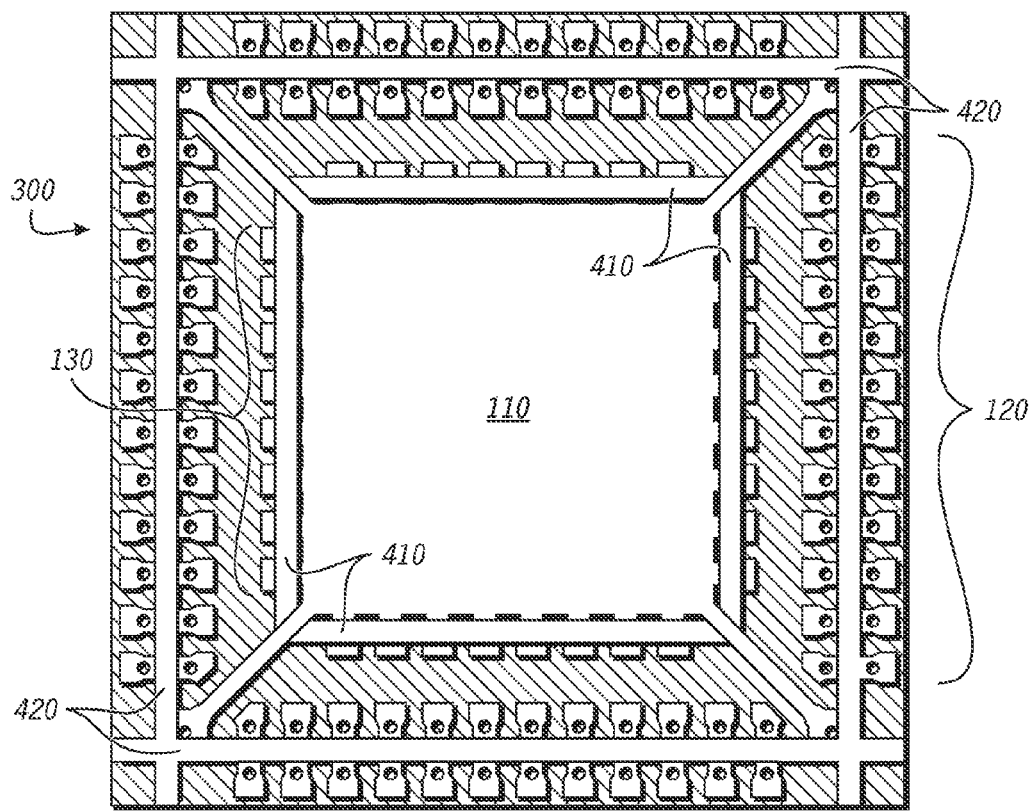

FIGS. 4 and 5 include illustrations of a cross-sectional view and a top view, respectively, after forming trenches 410 and 420. The trenches 410 and 420 can be formed by removing the conductive members 140 and portions of leadframe lying between the conductive flag 110 and the leads 130. In the illustrated embodiment, the removal of the conductive members forms trenches that electrically isolate the leads from one another and from the conductive flag 110.

In an embodiment, the depths of the trenches 410 and 420 should be sufficiently deep to remove the conductive members, so that the leads 122 and 124 are no longer electrically connected to one another, and the leads 130 are no longer electrically connected to the conductive flag 110. Thus, the depths of the trenches 410 and 420 may correspond to the thicknesses of the conductive members 140. Alternatively, the trenches 410 and 420 may be slightly deeper than the thicknesses of the conductive members to allow for nonuniformity in the thicknesses of the conductive members. If needed or desired, an electrical test can be performed after forming the trenches 410 and 420 to ensure the leads 122, 124, and 130 and the conductive flag 110 are electrically isolated from one another. If not, the trenches 410 and 420 can be formed deeper or another removal technique can be performed to remove residual portions of the conductive members. As the trenches 410 and 420 are formed deeper, mechanical support of the leads 122 in relation to the rest of the package substrate 300 may become an issue. In an embodiment, the depths of the trenches 410 and 420 can be 10%, 20%, or 30% of the thickness of the packaging substrate 300, and in another embodiment, depths of the trenches 410 and 420 can be 70%, 80%, or 90% of the thickness of the packaging substrate 300. In a non-limiting embodiment, the depths of the trenches 410 and 420 are in a range of approximately 50% to approximately 70% of the thickness of the packaging substrate 300. After reading this specification, skilled artisans will be able to determine depths of the trenches 410 and 420 to meet the needs or desire for a particular application.

In another embodiment, the width of the trenches 410 and 420 should be sufficiently wide to remove the conductive members, so that the leads 122 along the trenches 420 are no longer electrically connected to one another, and the leads 124 along the trenches 420 are no longer electrically connected to one another. Thus, the widths of the trenches 410 and 420 may correspond to the widths of the conductive members 140. Alternatively, the trenches 410 and 420 may be slightly wider than the widths of the conductive members 140 to allow for nonuniformity in the widths of the conductive members. If needed or desired, an electrical test can be performed after forming the trenches 410 and 420 to ensure the leads 122 and 124 are electrically isolated from one another. If not, the trenches 410 and 420 can be formed wider or another removal technique can be performed to remove residual portions of the conductive members. As the trenches 410 and 420 are formed wider, the surface area of the leads 122, 124, and 130 may become reduced make subsequent formation of electrical connections between a die and the leads 122, 124, and 130 more difficult. After reading this specification, skilled artisans will be able to determine widths of the trenches to meet the needs or desire for a particular application.

Many different techniques can be used to form the trenches 410 and 420. In an embodiment, a saw can be used to cut through the conductive members such that the packaging material 240 is exposed along the bottoms of the trenches 410 and 420. In another embodiment, a laser can be used. In another embodiment, a water jet or other pressurized fluid can be used to remove the portions of the leadframe 100 and form the trenches 420 and 410. When a mechanical operation is used for removing portions of the leadframe, trenches that are substantially parallel to one another may be formed during one pass or sets of actions, and trenches in a substantially perpendicular direction can be formed during a separate pass or separate set of actions.

In still another embodiment, etching can be performed to remove portions of the leadframe 100 to form the trenches 410 and 420. A masking layer can be formed over the leadframe 100 and packaging material 240 and expose regions of the leadframe 100 where the trenches 410 and 420 will be formed. In a particular embodiment, a dry etching technique can be used to remove the conductive members of the leadframe 100 to expose the packaging material 240 along bottoms of the trenches 410 and 420. In another embodiment, a wet chemical etching technique can be used. If needed or desired, a passivating agent may be used to reduce the likelihood of corrosion after etching has been performed. For example, if the leadframe includes aluminum and is dry etched, a fluorine-containing species can be used to passivate the exposed aluminum. If the leadframe includes copper and is wet etched, an imidizole or a benzotriazole compound can be used to passive the exposed copper. After reading this specification, skilled artisans will be able to determine the proper chemistries to perform the desired etches without significantly corroding remaining portions of the leadframe 100. The masking layer can be removed after etching.

Formation of the trenches 410 and 420 may be performed to substantially prevent the formation of burrs, filaments, or other residual parts of the conductive members 140, as such burrs, filaments, or other residual parts could form undesired electrical shorts or leakage paths within the finished device. However, if burrs, filaments, or other residual parts of the conductive members are formed 140, such burrs, filaments, or other residual parts may be removed before an encapsulant is formed within the trenches 410 and 420.

Figure 6:
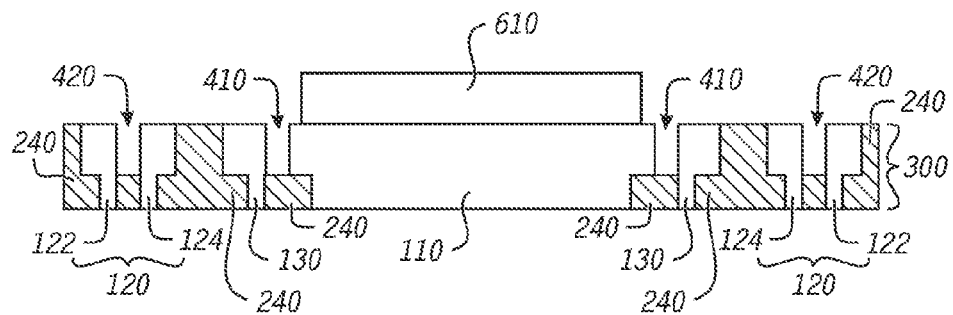
FIGS. 6 and 7 include illustrations of a cross-sectional view and a top view, respectively, of the packaging substrate of FIGS. 4 and 5 after attaching a die to a conductive flag of the leadframe.
Figure 7:
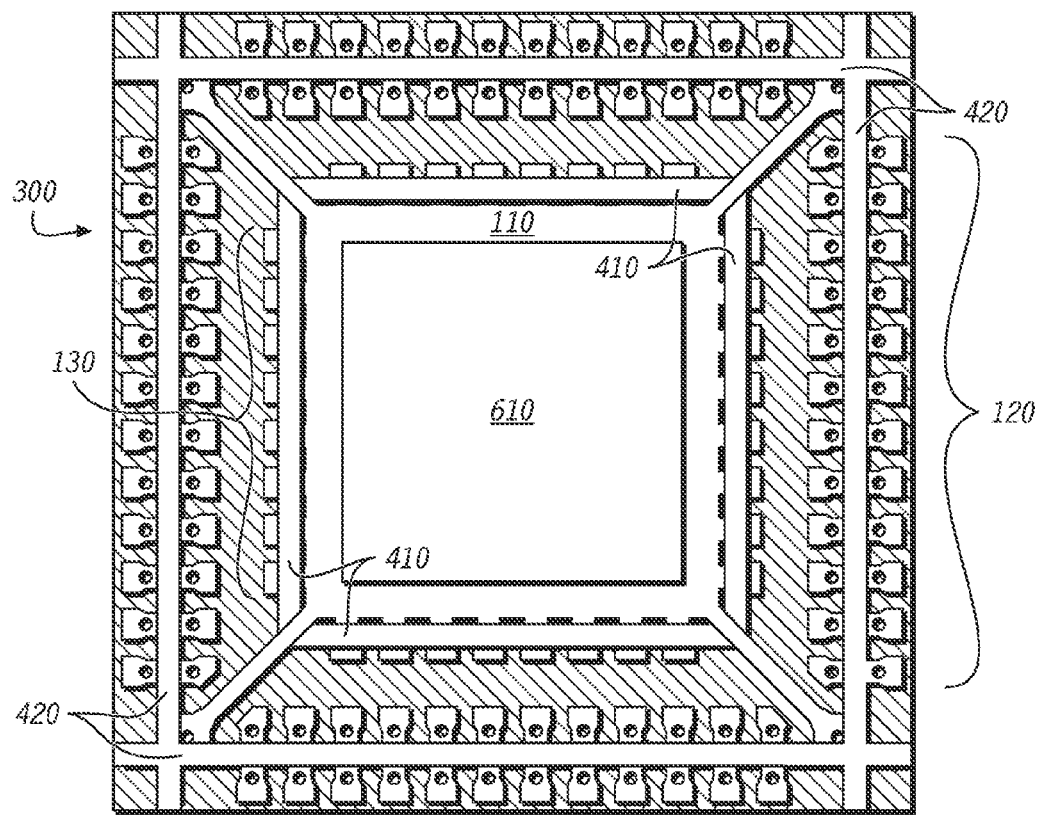

FIGS. 6 and 7 include a cross-sectional view and a top view, respectively, of the packaging substrate 300 after placing a die 610 over the packaging substrate 300. In a particular embodiment, the die 610 can be attached and electrically connected to the conductive flag 110. Such a configuration may allow the die substrate of the die 610 to be biased separately from the terminals of the die 610 that connect to the leads 122, 124, and 130. The terminals of the die 610 can be in the form of bond pads, solderable metal, or another suitable material used to allow signals to be sent or received by the die 610. In another embodiment (not illustrated), the conductive flag 110 may not be used and the die 610 can be attached to the packaging material 240.

Figure 8:
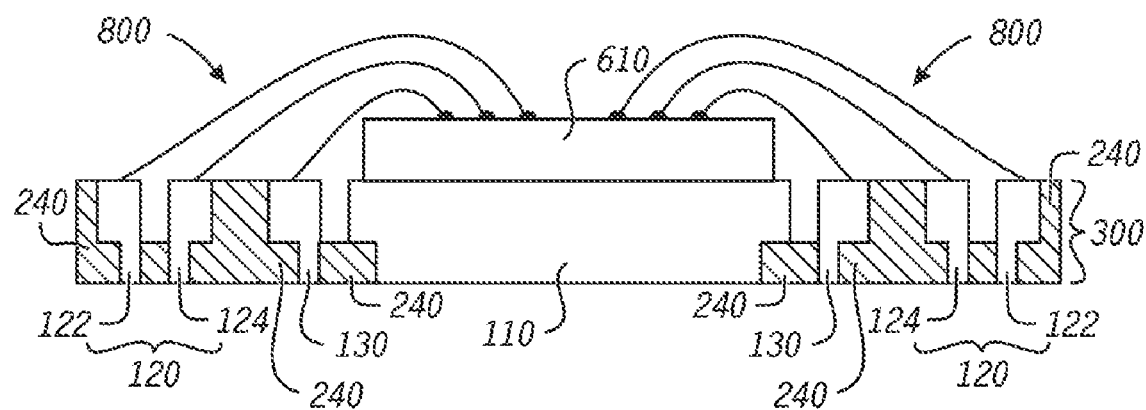
FIG. 8 includes an illustration of a cross-sectional view of the packaging substrate and die of FIGS. 6 and 7 after electrically connecting terminals of the die to leads of the leadframe.

FIG. 8 in includes an illustration of a cross-sectional view of the electronic device after forming electrical connections between terminals of the die 610 and leads 122, 124, and 130. In a particular embodiment, wire bonds 800 are formed to complete the electrical connections between terminals of the die 610 and the die connection surfaces of the leads 122, 124, and 130. In another embodiment, a direct chip attach, flip-chip technique, or another technique can be used to make electrical connections between the terminals of the die 610 and the die connection surfaces of the leads 122, 124, and 130. In this particular embodiment, a solder material can be formed on the terminals of the die 610 or the die connection surfaces of the leads 122, 124, and 130. A solder flow operation can be performed to flow the solder material such that the terminals of the die 610 and the leads 122, 124, and 130 become electrically connected.

Figure 9:
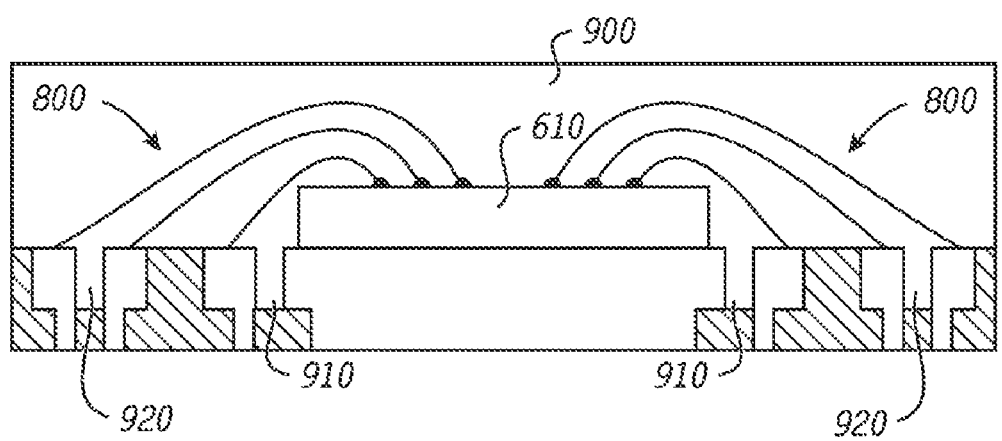
FIGS. 9 and 10 include illustrations of a cross-sectional view and a perspective view, respectively, of the packaging substrate and die of FIG. 8 after forming an encapsulant.
Figure 10:
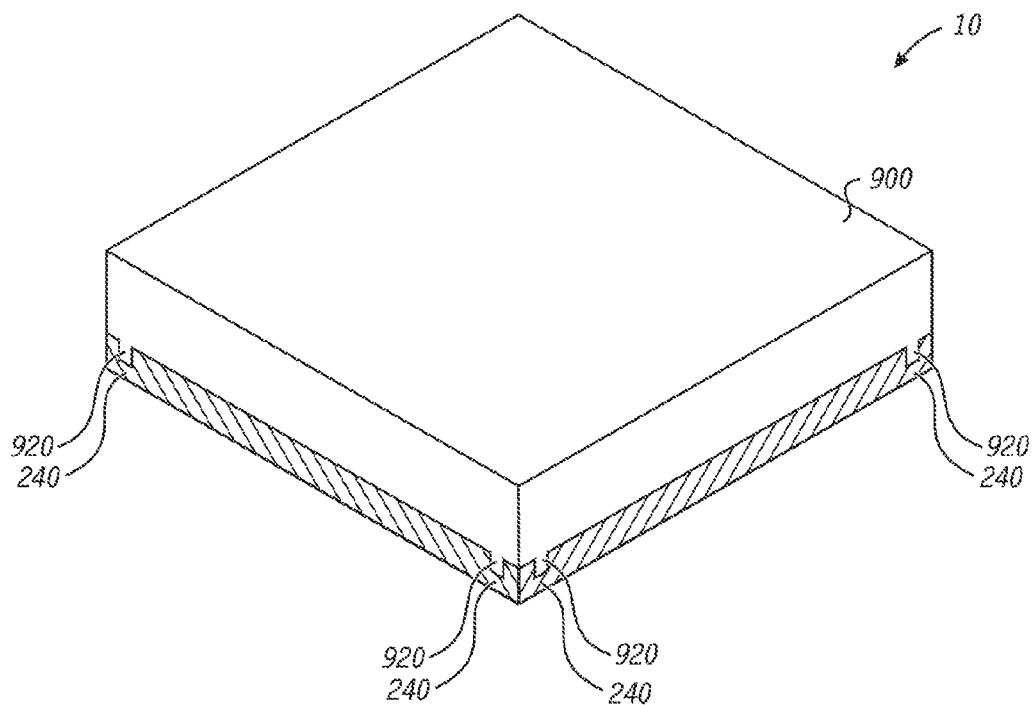
Figure 11:
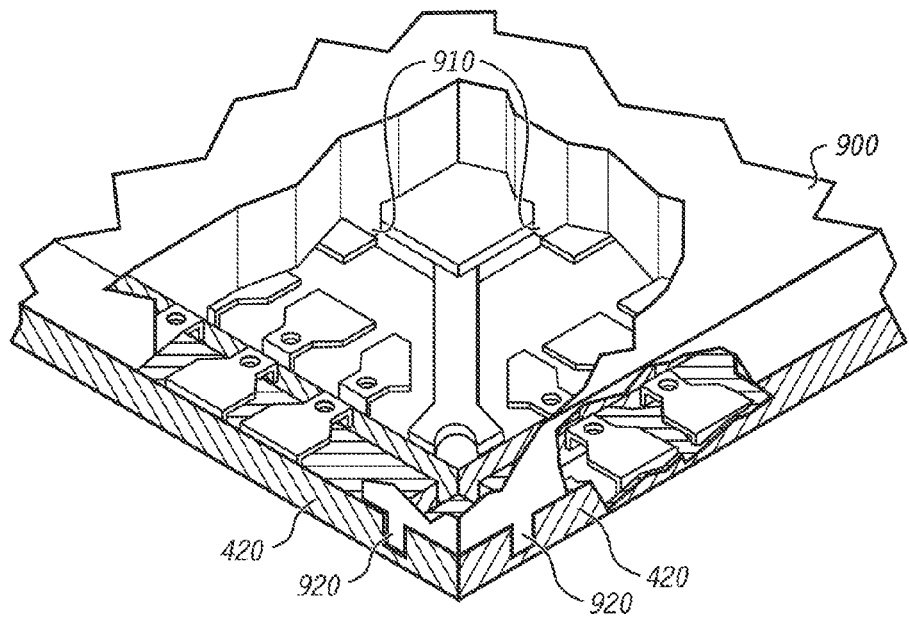
FIG. 11 includes an illustration of a partial cut-away perspective view of the package of FIGS. 9 and 10.

FIGS. 9 and 10 include a cross-sectional view and a perspective view, respectively, of the electronic device 10 after an encapsulant 900 is formed over the leads, the packaging material, and the die. In a particular embodiment, the encapsulant 900 can include a conventional or proprietary over-molding compound used in the semiconductor industry, and the encapsulant 900 may have the same or different composition as compared to the packaging material 240. Portions 910 and 920 of the encapsulant enter the trenches 410 and 420, respectively, to substantially fill the trenches. The portions 910 and 920 can help increase the amount of force needed to remove the encapsulant 900. Referring to FIG. 10, the encapsulant 900 can be seen along the top of the electronic device. In another embodiment (not illustrated), the leads 122 may be visible from a side of the package. Portions of the packaging material 240 are also visible as are the portions 920 of the encapsulant 900 that are within the trenches 420. Although not illustrated, the bottom side of the packages includes the external contacting services of the leads 122, 124, and 130, as well as the conductive flag 110. FIG. 11 includes a partial cutaway of a portion of the package to illustrate that the portions 910 and 920 of the encapsulant 900 lie within the trenches 410 and 420, respectively.

Other embodiments can be used without departing from the concepts described herein. In another embodiment, the trenches 410 and 420 can be formed at different times. The trenches 410 and 420 may be formed after the die 610 is placed over the packaging substrate 300. In another embodiment, the trenches 410 and 420 may be formed after electrical connections are made between the die 610 and the leads 122, 124, and 130. As the trenches 410 and 420 are formed later in the process, the risk of damaging the die 610 or electrical connections increases, one or more removal techniques may no longer be feasible, or even if feasible, one or more of such removal techniques may be more difficult or have less process margin and result in a less robust manufacturing process. Still, there may be reasons why delaying the formation of the trenches should occur. After reading this specification, skilled artisans will appreciate that the timing used in forming the trenches 410 and 420 can be changed as needed or desired.

Figure 12:
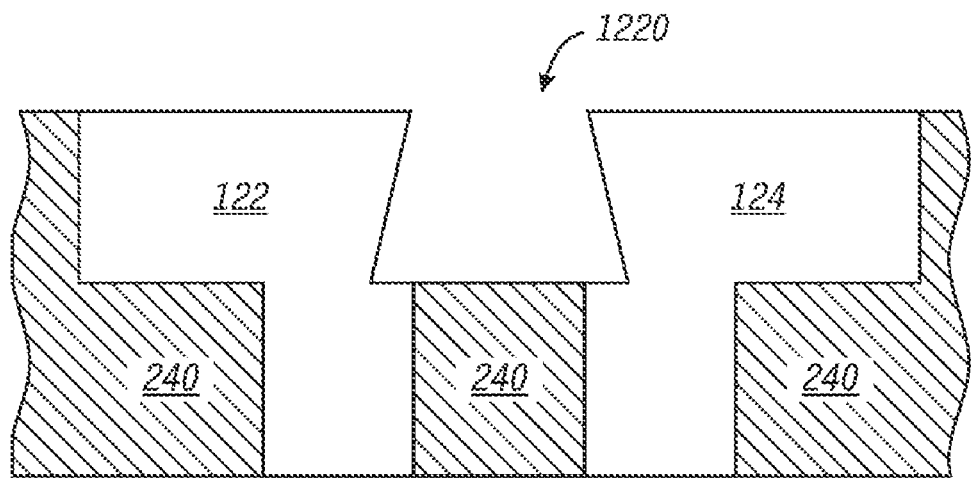
FIGS. 12 and 13 include illustrations of cross-sectional views of the packaging substrate of FIGS. 2 and 3 after removing conductive members to electrically isolate leads from one another in accordance with other embodiments.

In other embodiments, the trenches can have different shapes. The shapes of the trenches can be formed to increase further the amount of force needed to remove the encapsulant from the packaging substrate. In an embodiment illustrated in FIG. 12, a trench 1220 is formed such that the trench 1220 is narrower near the top and wider near the bottom. The trench 1220 can be formed be formed in a single action or using a series of actions. In one particular embodiment, a router having a bit with a complementary shape can be used to form the trench 1220. In another embodiment, one or more saw blades can be used that are oriented at angles slightly from vertical, that is, at angles not substantially perpendicular to the major surface of the packaging substrate 300. For example, during a first pass, a saw blade forms one of the sloped sidewalls of the trench 1220. The packaging substrate or the saw blade can be laterally rotated approximately 180°, and during a second pass, the saw blade forms the other sloped sidewall of the trench 1220. The relatively narrower portion near the top of the trench 1220 can help to hold the encapsulant in place to further reduce the likelihood that the encapsulant would be removed from the packaging substrate.

Figure 13:
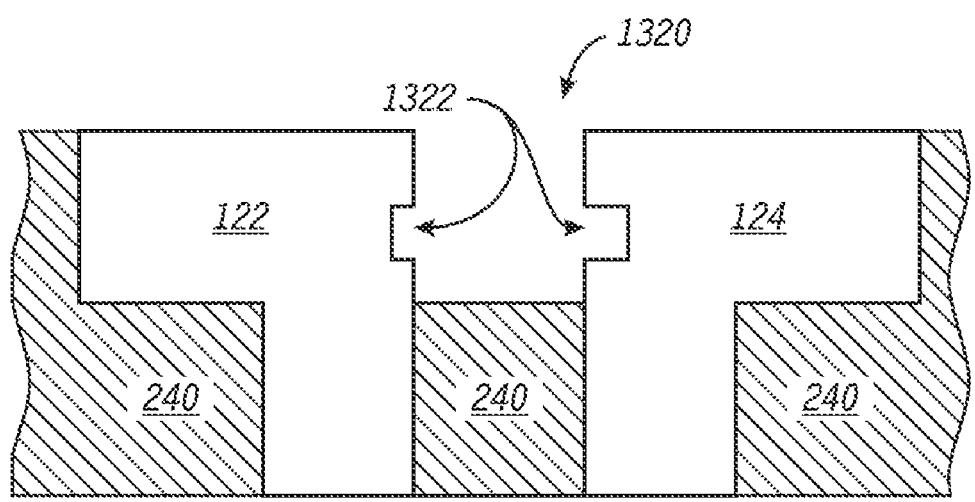

FIG. 13 illustrates another embodiment of a different trench shape. More specifically, the trench 1320 includes a cutout portion 1322 of the leads 122 and 124. The cutout portion 1322 is spaced apart from the die connection surface of the leads 122 and 124. The cutout portion 1322 may be moved to be along the bottom of the trench 1320, at a higher elevation within the trench 1320, or at another location. The cutout portion 1322 may have a different shape if needed or desired. After reading this specification, skilled artisans will appreciate that different embodiments can be used to achieve other shapes of the trenches without deviating from the concepts as described herein.

The concepts as described herein can be used with packages having rows or columns of leads that are electrically connected to one another when part of a leadframe or other similar configuration is removed to electrically isolate leads from one another in a finished package. Still further, the concepts are well suited for leadless packages or packages that have a high pin count. An exemplary form of the package includes a quad flat non-leaded ("QFN"), a ball grid array ("BGA"), a leadless land grid array ("LLGA"), or the like.

In another embodiment, an A-stage, B-stage technique can be used to form the packaging material 240. In this particular embodiment, a liquid paste (also called an A-stage liquid paste) is applied to the leadframe 100 using a liquid coating technique, such as screen printing, stencil printing, spin coating, spraying, another suitable coating technique, or any combination thereof. The combination of the liquid paste and leadframe 100 are partially cured, so that the liquid paste is solid (also called a B-stage molding compound), so that the combination of the leadframe 100 and partially cured compound can be handled. During a subsequent operation, encapsulant 900 is applied, such that the pressure during application of the encapsulant 900 bonds the B-stage molding compound to the encapsulant 900. The B-stage molding compound becomes fully cured during the encapsulating operation. Alternatively, a separate curing operation may be performed if needed or desired.

Embodiments described herein can be used to provide benefits in particular applications. In some embodiments, the conductive members between rows or columns of leads, such as conductive members 140 between the leads 122 and 124 or other electrical connections, such as between the leads 130 and the conductive flag 110, can be removed relatively earlier in the process and be performed in a less complicated manner as compared to a conventional technique. In a conventional process, the trenches 410 and 420 as described herein are not formed before the encapsulant is applied, and thus, the leads in adjacent rows or columns are still electrically connected to one other or to a conductive flag. Thus, after die attachment, wire bonding, and encapsulation, the conductive members between the leads and conductive flag or other leads are finally removed. The operation involves sawing the package and performing other mechanical and chemical operations to remove the conductive members. By performing the conductive member removal operation relatively late in the process, as opposed to times as described herein, the complexity in removing the conductive members is significantly greater and the likelihood of mechanical damage to the die, wire bonds, other electrical connections, or other parts of the device is increased. Still further, the peripheral portions of the packaging substrate (similar to the locations where the leads 122 would lie) are substantially weakened by the operation and more likely to fail, thus, rendering the device non-functional. Unlike a conventional process, particular embodiments are performed as described herein and can obviate many of the problems that occur with the conventional process.

Further, in other embodiments, the trenches 410 and 420 can help to hold the encapsulant 900 in place, so that the encapsulant 900 would be less likely to be removed or would require more force to remove the encapsulant 900 from the packaging substrate 300. The trenches 410 and 420 provide regions increase the surface area between the encapsulant 900 and the packaging substrate 300. In particular embodiments, shapes of the trenches, such as trenches 1220 and 1320 can be used to further decrease the likelihood that the encapsulant 900 would be removed from the packaging substrate 300.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include providing a packaging substrate including a leadframe and packaging material, wherein the leadframe includes a first set of leads and a first conductive member lying between and electrically connecting the first set of leads to one another, and the packaging material lies between the leads within the first set of leads. The process can also include removing the first conductive member to form a first trench, wherein at least some of the leads within the first set of leads are electrically isolated from one another. The process can further include forming an encapsulant over the packaging substrate and within the first trench.

In an embodiment of the first aspect, removing the first conductive member includes sawing through part but not all of a thickness of the packaging substrate. In another embodiment, removing the first conductive member includes using a laser to remove part but not all of a thickness of the packaging substrate or using a pressurized fluid to remove part but not all of a thickness of the packaging substrate. In still another embodiment, removing the first conductive member includes selectively etching the leadframe to remove the first conductive member.

In a further embodiment of the first aspect, the process further includes attaching a die to the packaging substrate after removing the conductive member. In still a further embodiment, the process further includes placing a die over the packaging substrate, wherein the die includes terminals, and electrically connecting the terminals of the die to the first set of leads. In a particular embodiment, electrically connecting the terminals of the die to the first set of leads is performed after removing the first conductive member. In a more particular embodiment, electrically connecting includes forming wire bonds between the terminals of the die and the first set of leads. In an even more particular embodiment, the leadframe further includes a conductive flag, and the process further includes attaching the die to the conductive flag such that a die substrate of the die is electrically connected to the conductive flag. In another particular embodiment, electrically connecting includes flowing solder to complete the electrical connection between the terminals of the die and the first set of leads.

In another embodiment of the first aspect, the leadframe further includes a conductive flag, and a second set of leads electrically connected to one another and the conductive flag, and the packaging material lies between the leads within the second set of leads. The process further includes removing a portion of the leadframe to form a second trench, wherein the conductive flag is electrically isolated from the second set of leads, and attaching a die to the conductive flag. Forming the encapsulant further includes forming the encapsulant within the second trench.

In a second aspect, an electronic device can include a packaging material having a first surface and a second surface opposite the first surface and leads including die connection surfaces and external connection surfaces. The first surface of the packaging material can lie at a first elevation that is closer to an averaged elevation of the die connecting surfaces than to an averaged elevation of the external connection surfaces, and the second surface of the packaging material can lie at a second elevation that is closer to the averaged elevation of the external connection surfaces than to the averaged elevation of the die connecting surfaces. A trench can extend from the first elevation towards the second elevation, wherein a first set of leads lie immediately adjacent to the trench, and the packaging material is exposed at the bottom of the trench.

In an embodiment of the second aspect, the electronic device further includes a die including terminals, wherein terminals of the die are electrically connected to at least some of the leads. In a particular embodiment, the electronic device further includes an encapsulant lying over the packaging material, leads, die, and within the trench. In another particular embodiment, the electronic device further includes wire bonds that electrically connect the terminals of the die to the at least some of the leads. In a further embodiment, the electronic device further includes solder connections that electrically connect the terminals of the die to the at least some of the leads. In still a further embodiment, the electronic device further includes a conductive flag, wherein a die substrate of the die is attached and electrically connected to the conductive flag.

In a third aspect, an electronic device can include leads including die connection surfaces and external connection surfaces, and a packaging material that consists essentially of a molding compound, wherein the packaging material has a first surface and a second surface opposite the first surface. The first surface of the packaging material can lie at a first elevation that is closer to an averaged elevation of the die connecting surfaces than to an averaged elevation of the external connection surfaces, the second surface of the packaging material can lies at a second elevation that is closer to the averaged elevation of the external connection surfaces than to the averaged elevation of the die connecting surfaces, wherein the external connection surfaces of the leads do not significantly extend beyond the second surface of the packaging material. A trench can extend from the first elevation towards the second elevation, wherein a first set of leads lie immediately adjacent to the trench, and the packaging material is exposed at the bottom of the trench. The electronic device can also include a conductive flag and a die including terminals, wherein a die substrate of the die is attached and electrically connected to the conductive flag. The electronic device can further include bonded wires that electrically connect the terminals of the die with at least some of the lead, and an encapsulant over the leads, packaging material, the die, and within the trench. In an embodiment, the electronic device is in a form of a quad flat non-leaded package.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
   providing a packaging substrate including a leadframe and packaging material, wherein the leadframe includes a first set of leads and a first conductive member lying between and electrically connecting the first set of leads to one another, and the packaging material lies between the leads within the first set of leads, wherein the leadframe further comprises a conductive flag;
   removing the first conductive member to form a first trench, wherein at least some of the leads within the first set of leads are electrically isolated from one another;
   attaching a die to the conductive flag such that a die substrate of the die is electrically connected to the conductive flag; and
   forming an encapsulant over the packaging substrate and within the first trench.

2. The process of claim 1, wherein removing the first conductive member comprises sawing through part but not all of a thickness of the packaging substrate.

3. The process of claim 1, wherein removing the first conductive member comprises using a laser to remove part but not all of a thickness of the packaging substrate.

4. The process of claim 1, wherein removing the first conductive member comprises using a pressurized fluid to remove part but not all of a thickness of the packaging substrate.

5. The process of claim 1, wherein removing the first conductive member comprises selectively etching the leadframe to remove the first conductive member.

6. The process of claim 1, further comprising attaching a die to the packaging substrate after removing the conductive member.

7. The process of claim 1, further comprising:
placing the die over the packaging substrate, wherein the die includes terminals; and
electrically connecting the terminals of the die to the first set of leads.

8. The process of claim 7, wherein electrically connecting the terminals of the die to the first set of leads is performed after removing the first conductive member.

9. The process of claim 8, wherein electrically connecting comprises forming wire bonds between the terminals of the die and the first set of leads.

10. The process of claim 8, wherein electrically connecting comprises flowing solder to complete the electrical connection between the terminals of the die and the first set of leads.

11. The process of claim 1, wherein a portion the encapsulant within the first trench can be seen from an outside of the electronic device.

12. The process of claim 1, wherein:
the leads within the first set of leads have attachment surfaces to which electrical connections can be made to the die; and
the first trench includes a narrower portion closer to the attachment surfaces and a wider portion further from the attachment surfaces.

13. The process of claim 1, wherein:
a lead extends diagonally from the conductive flag towards a corner of the packaging substrate; and
after removing the first conductive member, the lead for the conductive flag is electrically isolated from the first set of leads.

14. A process of forming an electronic device comprising:
providing a packaging substrate including a leadframe and packaging material, wherein the leadframe includes a first set of leads and a first conductive member lying between and electrically connecting the first set of leads to one another, and the packaging material lies between the leads within the first set of leads, wherein the leadframe further comprises a conductive flag, and a second set of leads electrically connected to one another and the conductive flag, and the packaging material lies between the leads within the second set of leads;
removing the first conductive member to form a first trench wherein at least some of the leads within the first set of leads are electrically isolated from one another;
removing a portion of the leadframe to form a second trench, wherein the conductive flag is electrically isolated from the second set of leads;
attaching a die to the conductive flag; and
forming an encapsulant over the packaging substrate and within the first trench and within the second trench.

15. The process of claim 14, wherein a portion the encapsulant within the first trench can be seen from an outside of the electronic device, and no portion of the encapsulant within the second trench cannot be seen from the outside of the electronic device.

16. The process of claim 14, wherein:
the leads within the first set of leads have attachment surfaces to which electrical connections can be made to the die;
the first trench includes a narrower portion closer to the attachment surfaces and a wider portion further from the attachment surfaces.

17. The process of claim 14, wherein:
a lead extends diagonally from the conductive flag towards a corner of the packaging substrate; and
after removing the first conductive member and the portion of the leadframe, the lead for the conductive flag is electrically isolated from the first and second sets of leads.

18. The process of claim 14, wherein the die includes terminals, and the process further comprises electrically connecting the terminals of the die to the first and second sets of leads.

* * * * *